(12) United States Patent
Hagerup et al.

(10) Patent No.: US 10,119,992 B2
(45) Date of Patent: Nov. 6, 2018

(54) HIGH IMPEDANCE COMPLIANT PROBE TIP

(71) Applicant: Tektronix, Inc., Beaverton, OR (US)

(72) Inventors: William A. Hagerup, Portland, OR (US); Julie A. Campbell, Beaverton, OR (US); Ira G. Pollock, Hillsboro, OR (US); James E. Spinar, Clackamas, OR (US); Kathleen F. M. Ullom, West Linn, OR (US); Charles M. Hartmann, Forest Grove, OR (US); Daniel J. Ayres, Warren, OR (US); Christina D. Enns, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 135 days.

(21) Appl. No.: 14/676,703

(22) Filed: Apr. 1, 2015

(65) Prior Publication Data
US 2016/0291054 A1     Oct. 6, 2016

(51) Int. Cl.
*G01R 1/067*     (2006.01)
(52) U.S. Cl.
CPC ..... *G01R 1/06722* (2013.01); *G01R 1/06788* (2013.01); *G01R 1/06733* (2013.01)
(58) Field of Classification Search
CPC ............ G01R 1/06722; G01R 1/06788; G01R 1/06733
USPC .................................................... 324/755.05
See application file for complete search history.

(56) References Cited

U.S. PATENT DOCUMENTS

| | | | | |
|---|---|---|---|---|
| 2,658,980 | A | * | 11/1953 | Weides ................. H01C 1/146 156/86 |
| 3,678,417 | A | * | 7/1972 | Ragan ................... H01P 1/268 333/22 R |
| 4,159,461 | A | * | 6/1979 | Kost ..................... H01C 7/003 29/620 |
| 5,136,237 | A | | 8/1992 | Smith et al. |
| 6,222,378 | B1 | | 4/2001 | Campbell et al. |
| D444,401 | S | | 7/2001 | Campbell |
| D444,720 | S | | 7/2001 | Campbell |
| D444,721 | S | | 7/2001 | Campbell |
| 6,462,529 | B1 | | 10/2002 | Campbell |
| 6,518,780 | B1 | | 2/2003 | Campbell et al. |
| 6,538,424 | B1 | | 3/2003 | Campbell |
| 6,605,934 | B1 | | 8/2003 | Campbell et al. |
| 6,650,131 | B2 | | 11/2003 | Campbell et al. |
| 6,809,535 | B2 | | 10/2004 | Campbell |

(Continued)

*Primary Examiner* — Patrick Assouad
*Assistant Examiner* — Khristopher Yodichkas
(74) *Attorney, Agent, or Firm* — Miller Nash Graham & Dunn; Kevin D. Dothager (57) ABSTRACT

A test probe tip can include a compliance member or force deflecting assembly and a tip component. The compliance member or force deflecting assembly can include a plunger component and a barrel component to receive the plunger component, wherein the plunger component is configured to slide axially inside the barrel component. The test probe tip can also include a spring mechanism within the barrel component to act on the plunger component, and a resistive/impedance element coupled with the plunger component at one end and with the tip component at the opposite end, the resistive/impedance element including at least one rod having a semi-cylindrical form and a resistive material situated thereon.

17 Claims, 8 Drawing Sheets

(56) References Cited

U.S. PATENT DOCUMENTS

| | | |
|---|---|---|
| 6,828,769 B2 | 12/2004 | Campbell et al. |
| 6,863,576 B2 | 3/2005 | Campbell et al. |
| 6,956,362 B1 | 10/2005 | Campbell et al. |
| 7,009,377 B2 | 3/2006 | Campbell et al. |
| 7,019,544 B1 | 3/2006 | Jacobs et al. |
| 7,116,121 B1 * | 10/2006 | Holcombe ......... G01R 1/06772 324/754.07 |
| 7,140,105 B2 | 11/2006 | Campbell |
| 7,173,439 B1 | 2/2007 | Campbell et al. |
| 7,202,678 B2 | 4/2007 | Campbell et al. |
| 7,221,179 B1 | 5/2007 | Campbell |
| 7,262,614 B1 * | 8/2007 | Campbell .......... G01R 1/06788 324/755.05 |
| 7,295,020 B2 | 11/2007 | Campbell et al. |
| 7,317,312 B1 | 1/2008 | Tsai et al. |
| 7,321,234 B2 | 1/2008 | Campbell et al. |
| 7,432,698 B1 | 10/2008 | Campbell et al. |
| 7,492,177 B1 | 2/2009 | Campbell |
| 7,525,328 B2 | 4/2009 | Campbell et al. |
| 7,671,613 B1 | 3/2010 | Campbell |
| 8,098,078 B1 | 1/2012 | Campbell |
| 8,134,377 B1 | 3/2012 | Campbell et al. |
| 8,421,488 B1 | 4/2013 | Campbell et al. |
| 8,786,299 B1 | 7/2014 | Campbell |
| 2006/0267606 A1 * | 11/2006 | Groshong .......... G01R 1/06772 324/754.07 |
| 2007/0159267 A1 * | 7/2007 | Nishimura .............. H01P 11/00 333/81 A |
| 2011/0090665 A1 * | 4/2011 | Korony ................ H01C 1/148 361/821 |

* cited by examiner

HIGH IMPEDANCE COMPLIANT PROBE TIP

TECHNICAL FIELD

This disclosure relates generally to test probes and, more particularly, to probe tips for test probes.

BACKGROUND

Today's engineers are attempting to test devices that carry high-speed serial busses. Many of these devices can be identified as, but are not limited to, double data rate second generation (DDR2) synchronous dynamic random-access memory (SDRAM), double data rate fourth generation (DDR4) SDRAM, and peripheral component interconnect express (PCIe). The magnitude of voltage swings and pulse frequencies are very high and the complexity of the signaling requires precise electrical probing. These and other busses are becoming highly prevalent in various types of consumer hardware devices. There are many test points of interest in each of these products.

The test points in these products vary greatly in both geometry and accessibility, usually requiring one or two points of contact. Typically, points of contact include micro traces, vias, component pads, and connector contacts that provide electrical contact with and, thus, access to high-speed signals. However, the test points are not always in the same plane and, if two probe contacts are required at once (e.g., as in the case of a differential probe), tip compliance is highly desirable to assist with positioning the probe for proper contact. Points of contact may reside on principal component analysis (PCA) hardware in virtually every angle of orientation, including from vertical to horizontal. In these types of scenarios, the test points are better accessed by probe tips with compliance.

While there are semi-permanent forms of probe contact for these access points, including the soldering or conductive epoxying of wires to these points, such solutions present a number of disadvantages, including potential damage to the device under test (DUT) during connection, long set-up times, and a requirement for exceptional dexterity skills in order to solder wires to these test points. Also, semi-permanent contacts do not provide for quick debugging. Solder-in probe tips tend to wear out after only a few connections and, thus, create a need for replacements, which can be significantly expensive. Finally, there tends to be a high variability in the signal fidelity, particularly in upper signal frequencies, due to the quality and geometry of solder and/or epoxy connections.

Accordingly, there remains a need for improved probe tips for use in connection with test probes.

SUMMARY

Embodiments of the disclosed technology generally pertain to probe tips suitable for use with test probes. A test probe tip may include a compliance member or force deflecting assembly that includes a barrel component that receives a plunger base coupled with a resistive/impedance element that is also coupled with a tip component. A spring mechanism may be trapped or otherwise positioned within the barrel component and the plunger base may be configured to slide axially inside the barrel component and be acted upon by the spring mechanism therein to advantageously create a compression resistance, e.g., with a test point on a DUT.

DETAILED DESCRIPTION

Embodiments of the disclosed technology generally include probe tips suitable for use with a test probe and configured to provide a precise, height-compliant, quick, and light-pressure contact with a test point, e.g., on a device under test (DUT). Such a probe tip may be configured as a spring probe that includes a resistive or impedance element positioned nearly at the point of contact with the DUT. The resistive or impedance element may greatly improve the through response of the spring probe and also decrease the DUT loading significantly, thus enabling high-speed signal acquisition.

Test probes and probe tips in accordance with the disclosed technology may advantageously create a better physical and electrical control of the contact area and also lend themselves well to fast debugging environments that typically cannot accommodate long contact setup times. Test probes and probe tips in accordance with the disclosed technology may advantageously provide superior visibility for connection placement and intuitive operation various classes of products, specifically hand-held or rapid placement probing.

Figure 1:
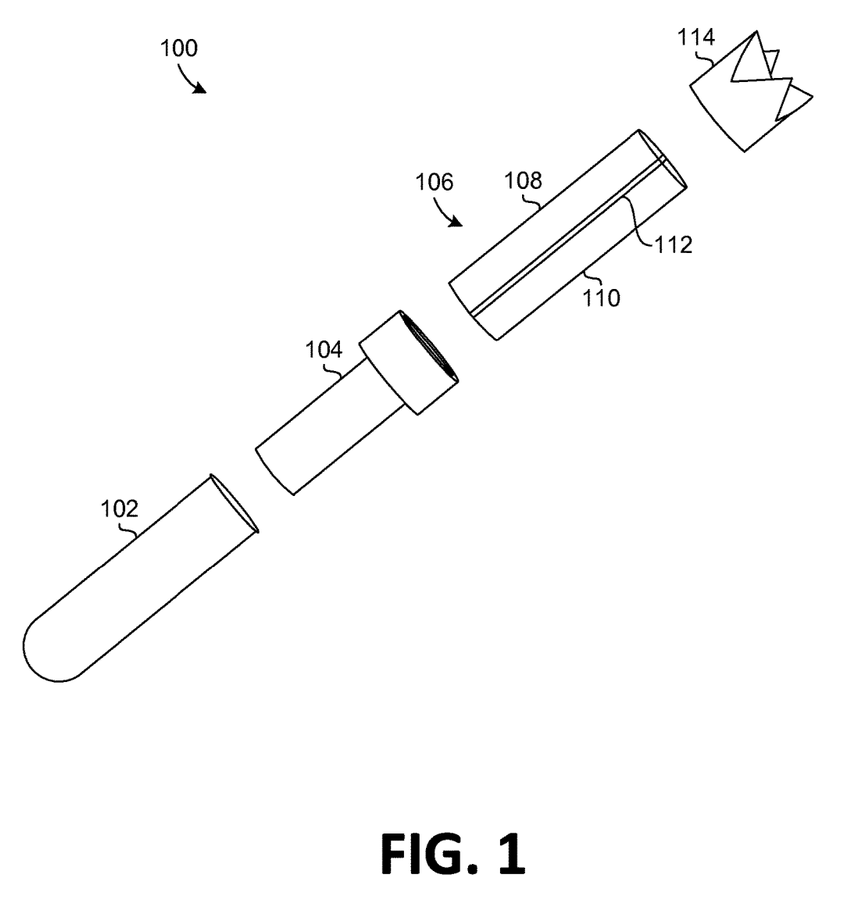
FIG. 1 illustrates an exploded view of a first example of a probe tip in accordance with certain embodiments of the disclosed technology.

FIG. 1 illustrates an exploded view of a first example of a test probe tip 100 in accordance with certain embodiments of the disclosed technology. In the example, the test probe tip 100 includes a compliance member or force deflecting assembly and a tip component 114 coupled therewith.

In the example, the compliance member or force deflecting assembly includes a barrel component 102 configured to be integrated with a test probe. The probe tip 100 also includes a resistive/impedance element 106 and a plunger base component 104 configured to be coupled, e.g., by way of an electro-mechanical bond, with an end surface of the resistive/impedance element 106.

In the example, the resistive/impedance element 106 includes a first rod 108 and a second rod 110. While the first and second rods 108 and 110, respectively, in the example each have generally semi-cylindrical (i.e., "D"-shaped) form, other suitable forms may be used in other embodiments. Either or both of the rods 108 and 110 may be zirconia extrusions, for example. In certain embodiments, the rods 108 and 110 may be end-plated, e.g., to electrically connect a resistor on the flat surface.

In the example, the resistive/impedance element 106 also includes an adhesive material 112 and a resistive material (not visible in the figure) situated between the first rod 108 and second rod 110. The adhesive material 112 may be a nonconductive epoxy or other suitable material to couple the first and second rods 108 and 110 together, and the resistive material may be a thin film resistor or thick film resistor that is fabricated on and along the flat surface of one of the rods 108 and 110, for example.

In the example, the tip component 114 is configured to be coupled, e.g., by way of an electro-mechanical bond, with an end surface of the resistive/impedance element 106 opposite the end surface that is coupled with the plunger base component 104. The tip component 114 may have one or more sharp points, e.g., to establish or otherwise facilitate fine-grain electrical connectivity with one or more contact points on a DUT.

A spring mechanism may be trapped or otherwise positioned within the barrel component 102, and the plunger base 104 may be configured to slide axially inside the barrel component 102 and, consequently, be acted upon by the spring mechanism positioned inside the barrel component 102 to advantageously create a compression resistance.

Figure 2:
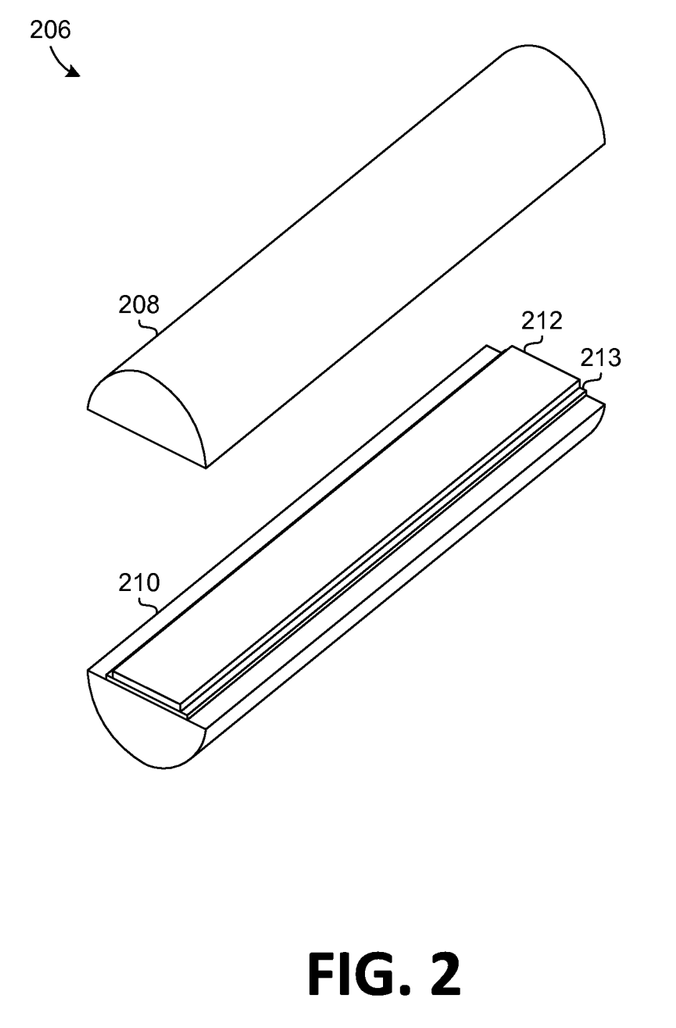
FIG. 2 illustrates an example of a resistive/impedance element such as the resistive/impedance element of the probe tip illustrated by FIG. 1 in accordance with certain embodiments of the disclosed technology.

FIG. 2 illustrates an example of a resistive/impedance element 206 such as the resistive/impedance element 106 of the probe tip 100 illustrated by FIG. 1 in accordance with certain embodiments of the disclosed technology. In the example, the resistive/impedance element 206 includes a first rod 208 and a second rod 210. While the first and second rods 208 and 210, respectively, in the example each have generally semi-cylindrical (i.e., "D"-shaped) form, other suitable forms may be used in other embodiments.

In the example, the resistive/impedance element 206 also includes an adhesive material 212 and a resistive material 213 situated between the first rod 208 and second rod 210. The adhesive material 212 may be a nonconductive epoxy or other suitable material to physically couple the first and second rods 208 and 210 together.

The resistive material 213, e.g., a thick film resistor or thin film resistor, may provide an electrical path between the ends of the resistive/impedance element 206. Among the various advantages offered by such implementations, e.g., forming the resistor 213 on a substantially flat surface, are ease of manufacturing/fabrication of the resistor as well as greater accuracy of the resistor.

One having ordinary skill in the art will appreciate that the adhesive material 212 and resistive material 213 illustrated by FIG. 2 are not drawn to scale and may have varying physical dimensions. In certain embodiments, the adhesive material 212 may be thicker, perhaps significantly thicker, than the resistive material 213. Alternatively or in addition thereto, the adhesive material 212 may have a greater width than that of the resistive material 213.

Figure 3:
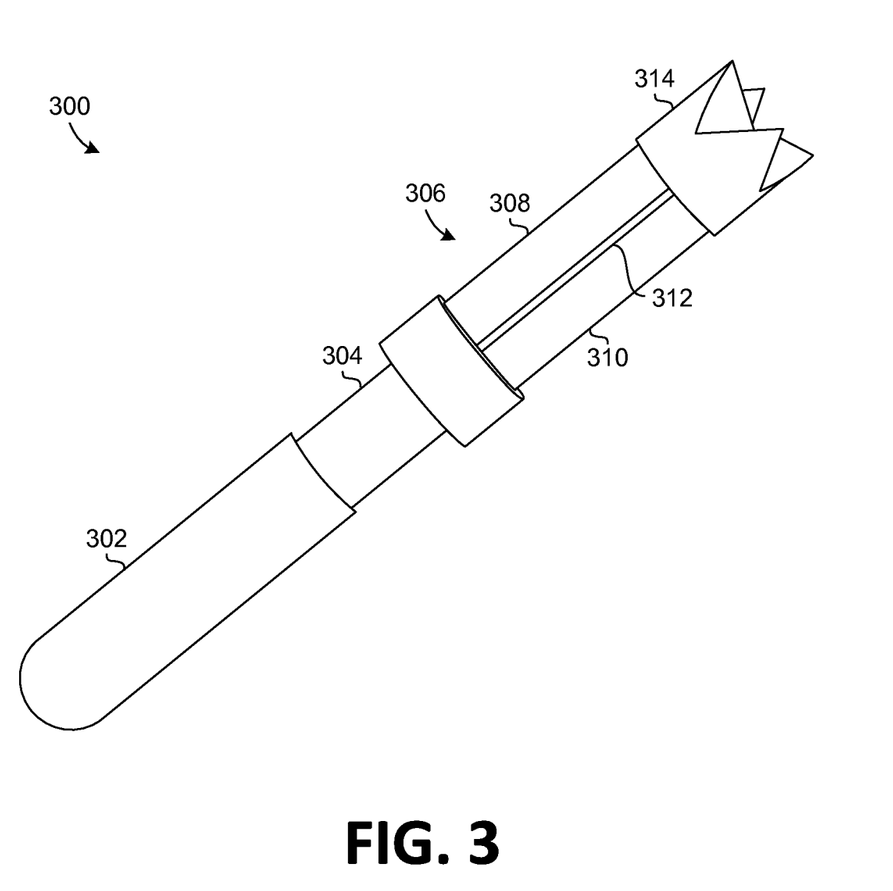
FIG. 3 illustrates an assembled view of the probe tip illustrated by FIG. 1 in accordance with certain embodiments of the disclosed technology.

FIG. 3 illustrates an assembled view of a first example of a test probe tip 300 having a compliance member or force deflecting assembly and a tip component coupled therewith in accordance with certain embodiments of the disclosed technology. In the example, a barrel component 302 receives a plunger base 304 that is coupled, e.g., by way of an electro-mechanical bond, with an end of a resistive/impedance element 306. The resistive/impedance element 306 may include a first rod 308 (e.g., a zirconia extrusion having a semi-cylindrical form) and a second rod 310 (e.g., a zirconia extrusion also having a semi-cylindrical form) with a material 312 (e.g., a non-conductive epoxy) and a resistive material (e.g., a thick film resistor or thin film resistor) situated therebetween.

In the example, a tip component 314 is coupled, e.g., by way of an electro-mechanical bond, with an end of the resistive/impedance element 306 opposite the end thereof that is coupled with the plunger base 304.

As with the test probe tip 100 illustrated by FIG. 1, a spring mechanism may be trapped or otherwise positioned within the barrel component 302, and the plunger base 304 may be configured to slide axially inside the barrel component 302 and be acted upon by the spring mechanism therein to advantageously create a compression resistance.

Figure 4:
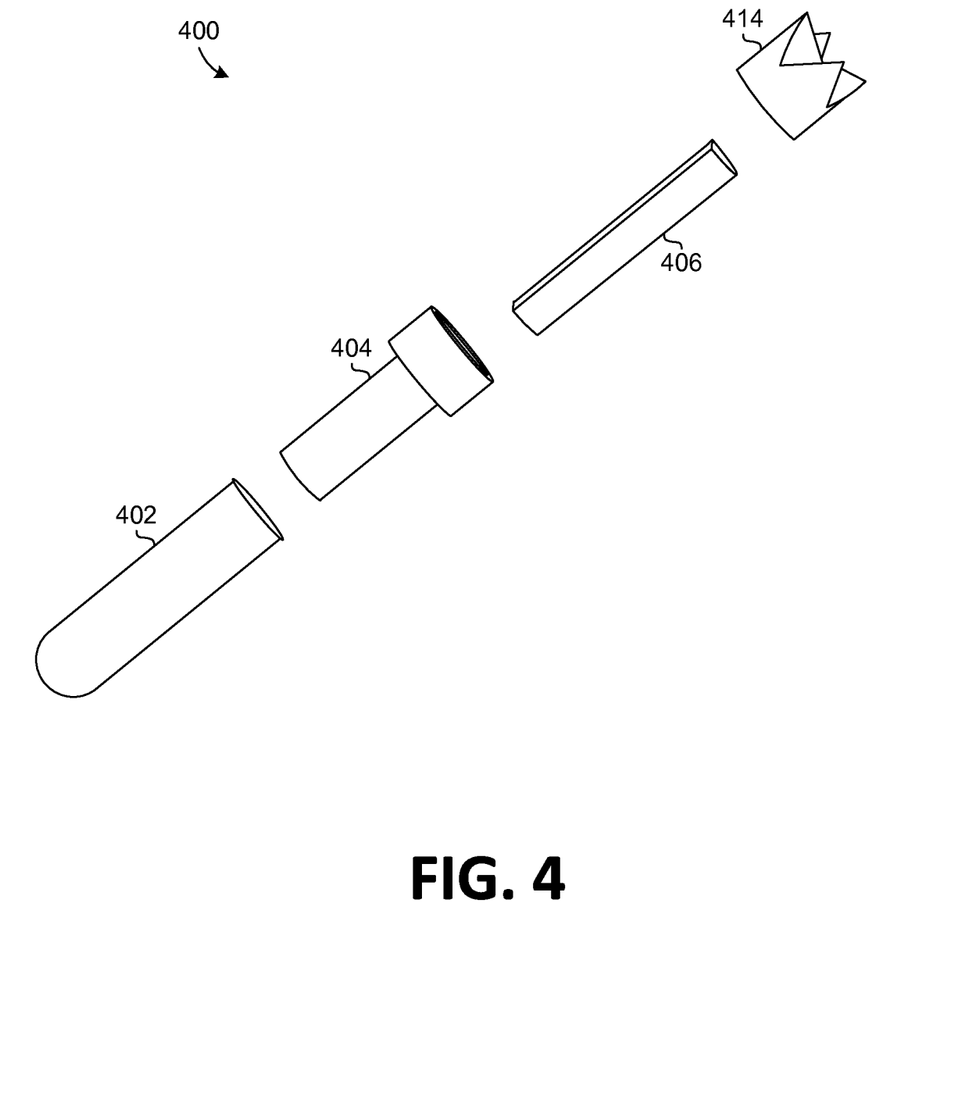
FIG. 4 illustrates an exploded view of a second example of a probe tip in accordance with certain embodiments of the disclosed technology.

FIG. 4 illustrates an exploded view of a second example of a test probe tip 400 in accordance with certain embodiments of the disclosed technology. In the example, the test probe tip 400 includes a compliance member or force deflecting assembly and a tip component 414 coupled therewith.

In the example, the compliance member or force deflecting assembly includes a barrel component 402 configured to be integrated with a test probe. The probe tip 400 also includes a resistive/impedance element 406 and a plunger base component 404 configured to be coupled, e.g., by way of an electro-mechanical bond, with an end surface of the resistive/impedance element 406.

In the example, the resistive/impedance element 406 includes a rod that has a generally semi-cylindrical (i.e., "D"-shaped) form, though any of a number of other suitable forms may be used in other embodiments. The rod may be a zirconia extrusion, for example. In certain embodiments, the rod may be end-plated, e.g., to electrically connect the resistor on the flat surface. A resistive material, such as the resistive material 213 of FIG. 2, may be situated on the flat surface of the rod, e.g., to provide an electrical connection between the ends of the resistive/impedance element 406.

In the example, the tip component 414 is configured to be coupled, e.g., by way of an electro-mechanical bond, with an end surface of the resistive/impedance element 406 opposite the end surface that is coupled with the plunger base component 404. The tip component 414 may have one or more sharp points, e.g., to establish or otherwise facilitate fine-grain electrical connectivity with one or more contact points on a DUT.

A spring mechanism may be trapped or otherwise positioned within the barrel component 402, and the plunger base 404 may be configured to slide axially inside the barrel component 402 and, consequently, be acted upon by the spring mechanism positioned inside the barrel component 402 to advantageously create a compression resistance.

Figure 5:
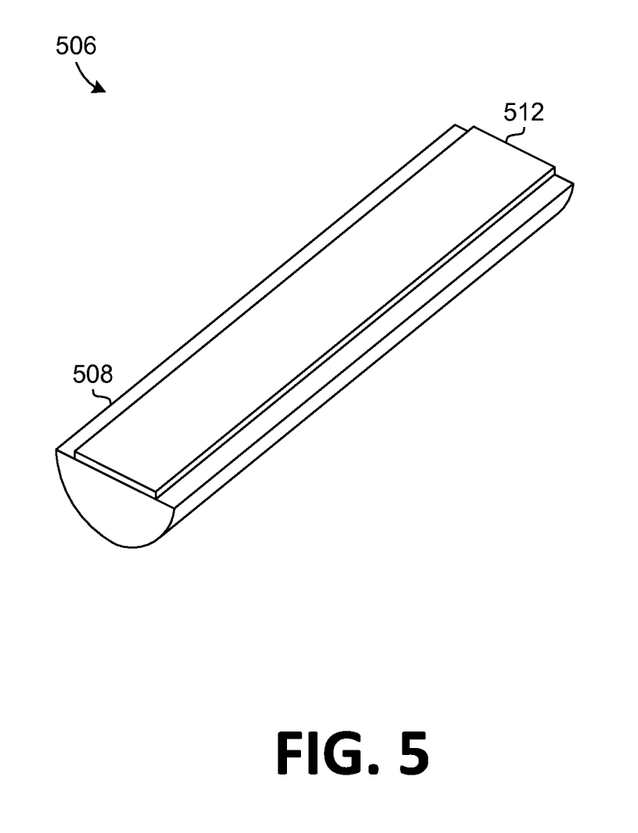
FIG. 5 illustrates an example of a resistive/impedance element such as the resistive/impedance element of the probe tip illustrated by FIG. 4 in accordance with certain embodiments of the disclosed technology.

FIG. 5 illustrates an example of a resistive/impedance element 506 such as the resistive/impedance element 406 of the probe tip 400 illustrated by FIG. 4 in accordance with certain embodiments of the disclosed technology. In the example, the resistive/impedance element 506 includes a rod 508 and a resistive material 513, e.g., a thick film resistor or thin film resistor, situated thereon. While the rod 508 has a generally semi-cylindrical (i.e., "D"-shaped) form, other suitable forms may be used in other embodiments.

Figure 6:
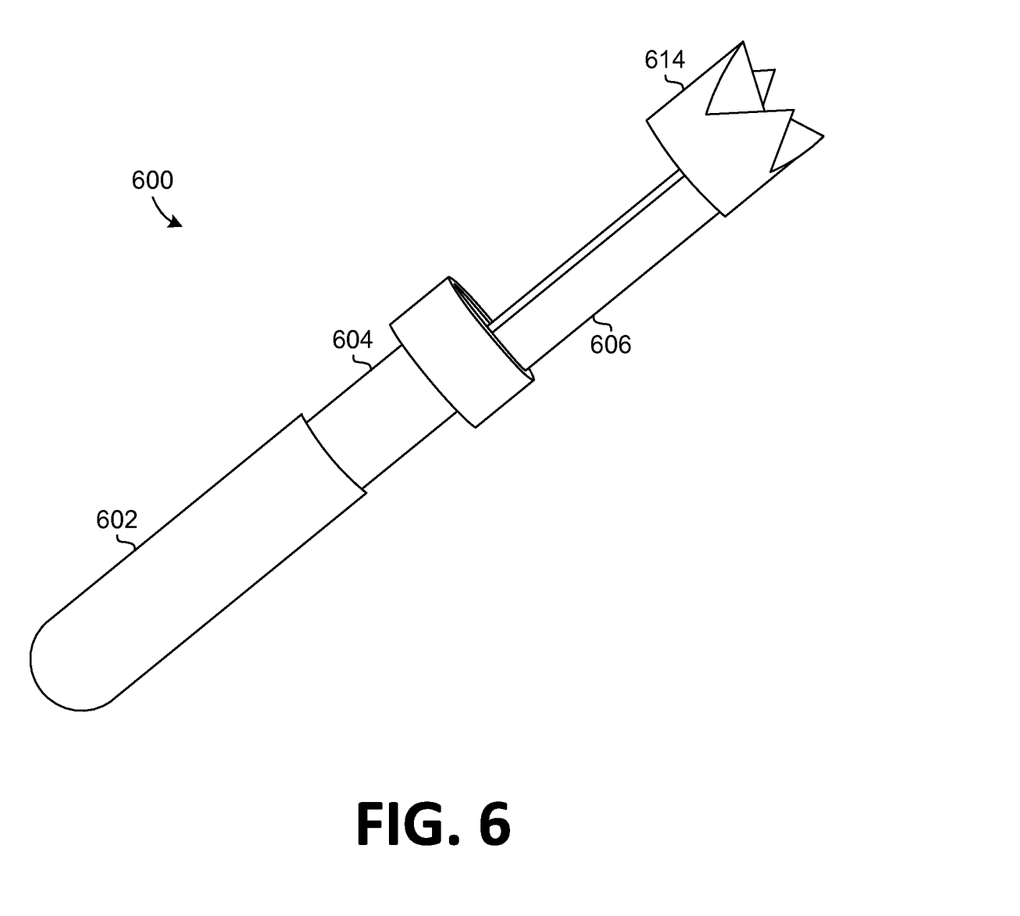
FIG. 6 illustrates an assembled view of the probe tip illustrated by FIG. 4 in accordance with certain embodiments of the disclosed technology.

FIG. 6 illustrates an assembled view of a second example of a test probe tip 600 having a compliance member or force deflecting assembly and a tip component coupled therewith in accordance with certain embodiments of the disclosed technology. In the example, a barrel component 602 receives a plunger base 604 that is coupled, e.g., by way of an electro-mechanical bond, with an end of a resistive/impedance element 606 that is a rod (e.g., a zirconia extrusion having a semi-cylindrical form) and may have a resistive material (e.g., a thick film resistor or thin film resistor) situated thereon.

In the example, a tip component 614 is coupled, e.g., by way of an electro-mechanical bond, with an end of the resistive/impedance element 606 opposite the end thereof that is coupled with the plunger base 604.

As with the test probe tip 400 illustrated by FIG. 4, a spring mechanism may be trapped or otherwise positioned within the barrel component 602, and the plunger base 604 may be configured to slide axially inside the barrel component 602 and be acted upon by the spring mechanism therein to advantageously create a compression resistance.

Figure 7:
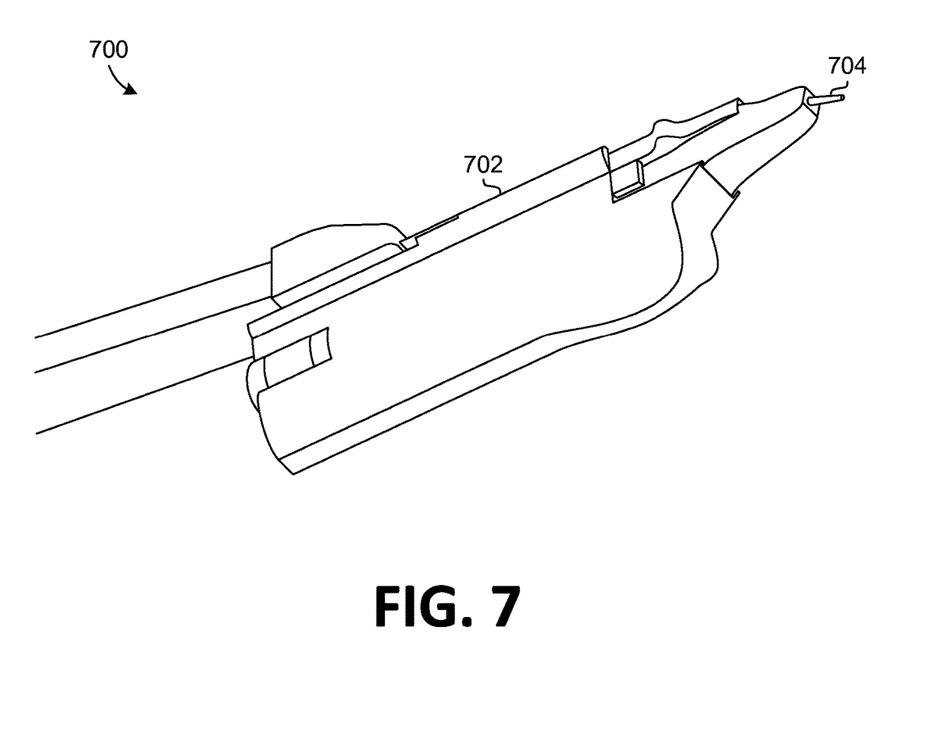
FIG. 7 illustrates an example of a single-tip test probe in accordance with certain embodiments of the disclosed technology.

FIG. 7 illustrates an example of a single-tip test probe 700 in accordance with certain embodiments of the disclosed technology. In the example, the test probe 700 includes a test probe body 702 and a test probe tip 704, such as the test probe tips 100 and 400 illustrated by FIGS. 1 and 4, respectively. A user may use the test probe 700 to create a compression resistance between the test probe tip 704 and a test point, such as a high-speed signal access point or other suitable point on a DUT, for example.

Figure 8:
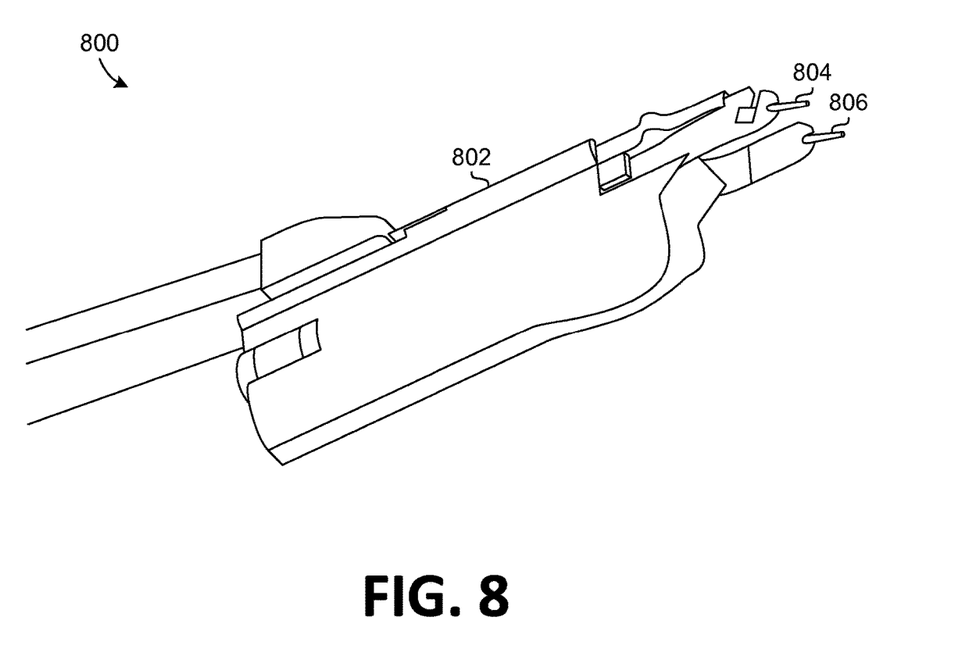
FIG. 8 illustrates an example of a differential probe in accordance with certain embodiments of the disclosed technology.

FIG. 8 illustrates an example of a differential probe 800 in accordance with certain embodiments of the disclosed technology. In the example, the differential probe 800 includes a probe body 802 and two test probe tips 804 and 806, such as the test probe tips 100 and 400 illustrated by FIGS. 1 and 4, respectively. A user may use the differential probe 800 to create a compression resistance between either or both of the test probe tips 804 and 806 and one or two test points, such as a high-speed signal access point or other suitable point on a DUT, for example.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A test probe tip, comprising:
   a force deflecting assembly;
   a resistor configured to be coupled with the force deflecting assembly, wherein the resistor comprises:
      a first rod having a substantially semi-cylindrical form that includes a first side extending along a longitudinal axis;
      a second rod having a substantially semi-cylindrical form that includes a second side extending along the longitudinal axis; and
      a resistive material disposed between the first side and the second side, such that the resistive element has a substantially cylindrical form with the resistive material providing a conductive path through the center of the cylindrical form; and
   a tip component configured to be coupled with the resistor, wherein the longitudinal axis extends from the force deflecting assembly to the tip component.

2. The test probe tip of claim 1, wherein the first rod comprises zirconia.

3. The test probe tip of claim 1, wherein each of the first and second rods comprise zirconia.

4. The test probe tip of claim 1, further comprising an adhesive material that couples the first side with the resistive material and the second side with the resistive material, wherein the adhesive material is a non-conductive epoxy such that the adhesive material forms an insulative layer between the first side and the resistive material and the second side and the resistive material.

5. The test probe tip of claim 1, wherein the force deflecting assembly includes:
   a plunger component configured to be coupled with the resistor element;
   a barrel component configured to receive the plunger component, wherein the plunger component is configured to slide axially inside the barrel component; and
   a spring mechanism positioned within the barrel component and configured to act on the plunger component responsive to the plunger component sliding in an inward direction inside the barrel component.

6. The test probe tip of claim 1, wherein the tip component includes at least one point configured to establish an electrical connection with a test point on a device under test (DUT).

7. The test probe tip of claim 5, wherein the spring mechanism is configured to create a compression resistance between the probe tip and a test point on a device under test (DUT).

8. The test probe tip of claim 1, wherein the resistive material is a film resistive material.

9. A test probe, comprising:
   a test probe body; and
   a test probe tip integrated with the test probe body, the test probe tip including:
      a compliance member;
      a resistor configured to be coupled with the compliance member, wherein the resistor comprises:
         a first rod having a substantially semi-cylindrical form that includes a first side extending along a longitudinal axis;
         a second rod having a substantially semi-cylindrical form that includes a second side extending along the longitudinal axis; and
         a resistive material structurally coupling the first side with the second side, such that the resistive element has a substantially cylindrical form with the resistive material providing a conductive path through the center of the cylindrical form; and
      a tip component configured to be coupled with the resistor, wherein the longitudinal axis extends from the force deflecting assembly to the tip component.

10. The test probe tip of claim 9, wherein the first rod comprises zirconia.

11. The test probe tip of claim 9, wherein each of the first and second rods comprises zirconia.

12. The test probe tip of claim 9, further comprising an adhesive material that couples the first side with the resistive material and the second side with the resistive material, wherein the adhesive material is a non-conductive epoxy such that the adhesive material forms an insulative layer between the first side and the resistive material and the second side and the resistive material.

13. The test probe of claim 9, wherein the compliance member includes:
a plunger component;
a barrel component configured to receive the plunger component, wherein the plunger component is configured to slide axially inside the barrel component;
a spring mechanism positioned within the barrel component and configured to act on the plunger component responsive to the plunger component sliding in an inward direction inside the barrel component.

14. The test probe of claim 9, wherein the tip component includes at least one point configured to establish an electrical connection between the test probe and a test point on a device under test (DUT).

15. The test probe of claim 13, wherein the spring mechanism is configured to create a compression resistance between the test probe and a test point on a device under test (DUT).

16. The test probe of claim 9, wherein the resistive material is a film resistive material.

17. The test probe of claim 9, wherein the test probe tip is a first test probe tip, the test probe further comprising a second test probe tip in a same configuration as the first test probe tip, such that the test probe is a differential test probe.

* * * * *